United States Patent
Akram

(12) 
(10) Patent No.: US 6,825,550 B2
(45) Date of Patent: *Nov. 30, 2004

(54) BOARD-ON-CHIP PACKAGES WITH CONDUCTIVE FOIL ON THE CHIP SURFACE

(75) Inventor: Salman Akram, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 191 days.

(21) Appl. No.: 09/389,844

(22) Filed: Sep. 2, 1999

(65) Prior Publication Data

US 2002/0060369 A1 May 23, 2002

(51) Int. Cl.[7] .............................................. H01L 23/48
(52) U.S. Cl. ...................... 257/678; 257/666; 257/667; 257/668; 257/669; 257/675
(58) Field of Search ................................. 257/666–669, 257/675, 678

(56) References Cited

U.S. PATENT DOCUMENTS

| | | | |
|---|---|---|---|
| 5,021,300 A | | 6/1991 | Stacey |
| 5,248,895 A | * | 9/1993 | Nakazawa .................. 257/669 |
| 5,300,812 A | * | 4/1994 | Lupinski et al. ............ 257/668 |
| 5,352,851 A | | 10/1994 | Wallace et al. |

(List continued on next page.)

OTHER PUBLICATIONS

Tummala, R. et al., "Microelectronics Packaging Handbook, Semiconductor Packaging" Part II, Second Ed. 1997, pp. 898–901.

(List continued on next page.)

*Primary Examiner*—Fetsum Abraham
(74) *Attorney, Agent, or Firm*—Wells St. John P.S.

(57) ABSTRACT

The invention encompasses a board-on-chip package comprising an insulative substrate having circuitry thereon and an opening therethrough. A semiconductive-material-comprising die is adhered to the substrate and electrically connected to the circuitry with a plurality of electrical interconnects extending through the opening. A metal foil is in physical contact with at least a portion of the die. The invention also encompasses a method of forming a plurality of board-on-chip packages. An insulative substrate is provided. Such substrate has a repeating circuitry pattern thereon, and a plurality of openings therethrough. The openings are in a one-to-one correspondence with individual of the repeated circuitry patterns. A plurality of semiconductive-material-comprising dies are adhered to the substrate. Circuitry supported by the dies is electrically connected with the circuitry on the substrate utilizing a plurality of electrical interconnects extending through the openings. A metal foil is joined to the substrate and extended over the plurality of dies. The substrate and metal foil are cut to form singulated die packages comprising a single die, a portion of the substrate having a single repeated pattern of the circuitry, and a portion of the metal foil.

34 Claims, 11 Drawing Sheets

U.S. PATENT DOCUMENTS

| | | | |
|---|---|---|---|
| 5,359,768 A | | 11/1994 | Haley |
| 5,442,231 A | * | 8/1995 | Miyamoto et al. .......... 257/667 |
| 5,559,369 A | | 9/1996 | Newman |
| 5,650,593 A | | 7/1997 | McMillan et al. |
| 5,661,086 A | | 8/1997 | Nakashima et al. |
| 5,677,566 A | | 10/1997 | King et al. |
| 5,723,907 A | | 3/1998 | Akram |
| 5,726,079 A | | 3/1998 | Johnson |
| 5,739,585 A | | 4/1998 | Akram et al. |
| 5,817,535 A | | 10/1998 | Akram |
| 5,857,767 A | * | 1/1999 | Hochstein ................... 362/547 |
| 5,972,736 A | | 10/1999 | Malladi et al. |
| 5,985,697 A | | 11/1999 | Chaney et al. |
| 5,990,550 A | | 11/1999 | Umezawa |
| 5,998,241 A | | 12/1999 | Niwa |
| 5,998,860 A | | 12/1999 | Chan et al. |
| 5,998,865 A | | 12/1999 | Akram |
| 5,999,415 A | | 12/1999 | Hamzehdoost |
| 6,008,074 A | | 12/1999 | Brand |
| 6,020,637 A | | 2/2000 | Karnezos |
| 6,048,755 A | | 4/2000 | Jiang et al. |
| 6,107,683 A | | 8/2000 | Castro et al. |
| 6,122,171 A | | 9/2000 | Akram et al. |
| 6,198,162 B1 | | 3/2001 | Corisis |
| 6,214,641 B1 | | 4/2001 | Akram |
| 6,215,180 B1 | | 4/2001 | Chen et al. |
| 6,225,695 B1 | | 5/2001 | Chia et al. |
| 6,249,041 B1 | | 6/2001 | Kasem et al. |
| 6,255,140 B1 | | 7/2001 | Wang |
| 6,271,586 B1 | | 8/2001 | Shen |
| 6,284,571 B1 | | 9/2001 | Corisis et al. |
| 6,300,165 B2 | | 10/2001 | Castro |
| 6,326,687 B1 | | 12/2001 | Corisis |
| 6,343,019 B1 | | 1/2002 | Jiang et al. |
| 6,399,425 B1 | | 6/2002 | Brand et al. |
| 6,461,894 B2 | | 10/2002 | Brand |
| 6,498,052 B2 | | 12/2002 | Brand |
| 6,518,098 B2 | | 2/2003 | Corisis |
| 6,528,890 B1 | | 3/2003 | Brand |

OTHER PUBLICATIONS

OTHER PUBLICATIONS

"How to Make IC Package", Internet Web pages from www.msato@iis.u–toyko.ac.ip web site, Aug. 31, 1998, 10 pages.

"SLD4M18DR400 4 Meg ×18 SLDRAM", Internet Web pages from www.sldram.com web site, 1998, 13 pages.

Tummala, R. et al., "Microelectronics Packaging Handbook, Subsystem Packaging" Part III, Second Ed. 1997, pp. 223–234.

U.S. patent application Ser. No. 09/146,118 (as filed and amended), Brand et al., filing date Sep. 2, 1998.

U.S. patent application Ser. No. 09/203,881 (as filed and amended), Brand, filed Dec. 1, 1998.

* cited by examiner

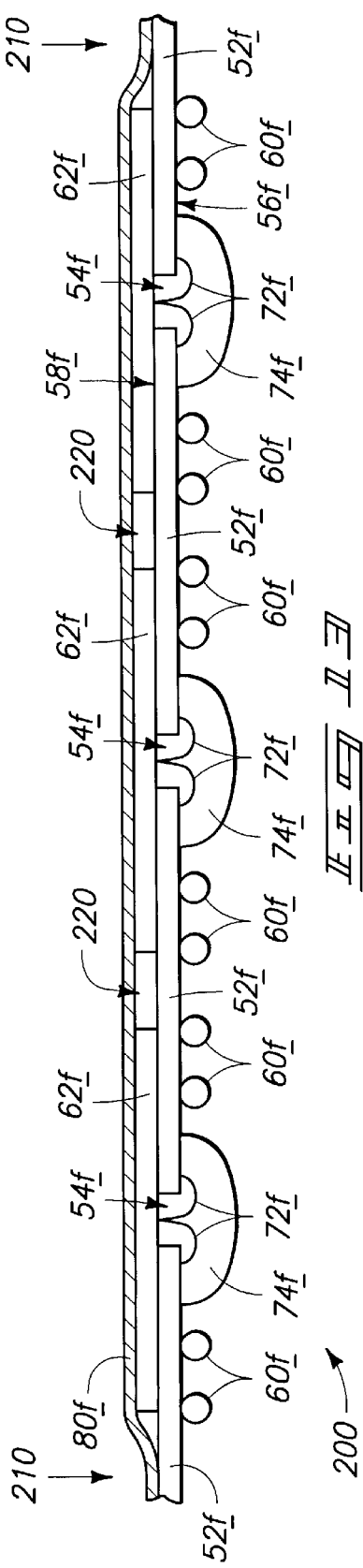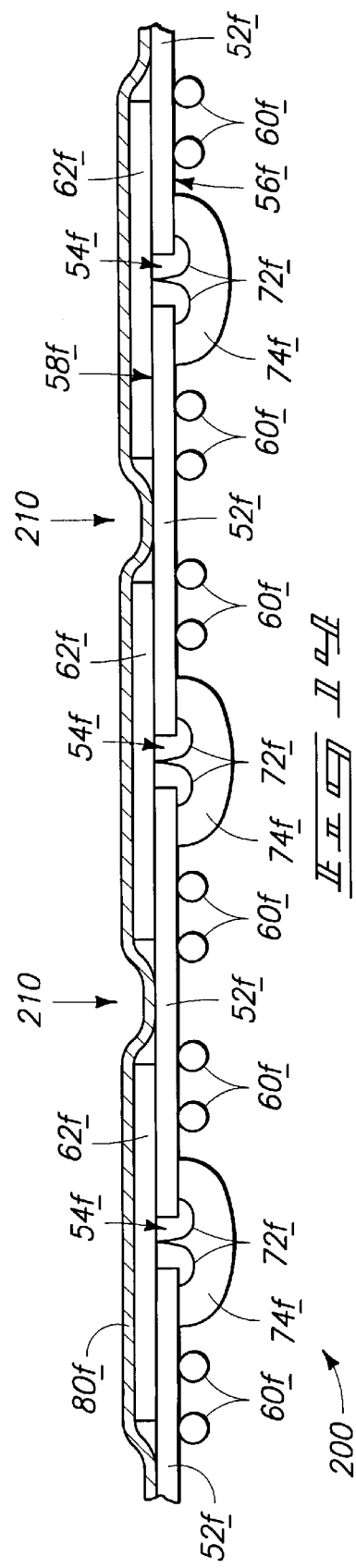

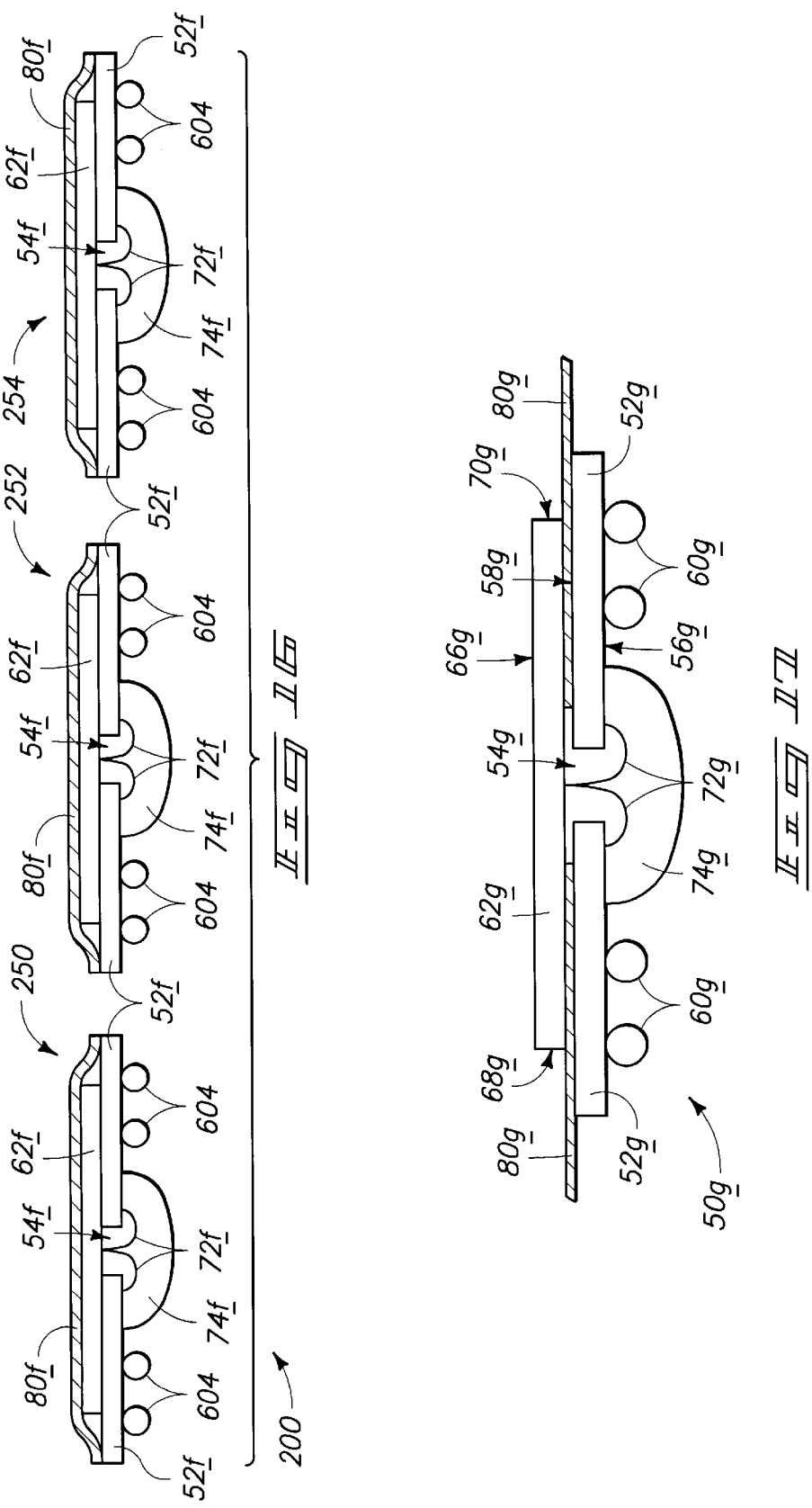

BOARD-ON-CHIP PACKAGES WITH CONDUCTIVE FOIL ON THE CHIP SURFACE

TECHNICAL FIELD

The invention pertains to board-on-chip packages, and to methods of forming board-on-chip packages.

BACKGROUND OF THE INVENTION

A prior art method of forming a board-on-chip package (which can be generally referred to as a die package) is described with reference to FIGS. 1–5. Referring first to FIG. 1, such illustrates a fragment of an assembly 10 comprising an insulative material substrate 12. Substrate 12 can comprise, for example, a circuit board, such as the type known in the art as FR-4™ (which can be obtained from Sumitomo of Japan), or BCB™ (which can be obtained from Toppan of Japan).

Substrate 12 comprises a top surface 13 and slits 18 extending therethrough. Circuitry 16 is formed on top of surface 13. Circuitry 16 and slits 18 form repeating patterns across top surface 13. The repeating patterns define separate units 19, 21 and 23, each of which ultimately forms a separate board-on-chip package.

Referring to FIGS. 2–4, an enlarged segment of substrate 12, corresponding to unit 21, is shown in three different views. FIG. 2 is a top view similar to the view of FIG. 1, FIG. 3 is an end view, and FIG. 4 is a view along the line 4—4 of FIG. 3. Substrate 12 is inverted in the view of FIG. 3 relative to the view of FIGS. 1 and 2. Accordingly, surface 13 (referred to as a top surface in referring to FIGS. 1 and 2) is a bottom surface in the view of FIG. 3. In referring to FIG. 3, surface 13 will be referred to as a first surface.

Substrate 12 comprises a second surface 15 in opposing relation relative to first surface 13. A semiconductive material-comprising chip (or die) 14 is adhered to surface 15 via a pair of adhesive strips 20. Strips 20 can comprise, for example, tape having a pair of opposing surfaces 22 and 24, with adhesive being provided on both of such opposing surfaces. Strips 20 typically comprise insulative material. Wire bonds 28 (only some of which are labeled in FIG. 2) extend from circuitry 16 and through slit 18 to electrically connect circuitry 16 to bonding pads 25 (only some of which are labeled in FIG. 2) associated with chip 14, and to accordingly electrically connect circuitry 16 with circuitry (not shown) comprised by chip 14. (The wire bonds and bonding pads are not shown in FIG. 4 for purposes of clarity in the illustration.)

FIG. 5 illustrates further processing of the assembly 10. Specifically, FIG. 5 illustrates units 19 and 21 of FIG. 1 after a first encapsulant 40 is provided over wire bonds 28, and a second encapsulant 42 is provided over chips 14 associated with units 19 and 21. First and second encapsulants 40 and 42 can comprise the same material and preferably comprise an insulative material, such as, for example, cured epoxy.

Conductive balls 31 are formed over portions of circuitry 16 (shown in FIGS. 1 and 2) to form a ball grid array over circuitry 16. Such array can subsequently be utilized to form a plurality of interconnects from circuitry 16 to other circuitry (not shown). Conductive balls 31 can be formed of, for example, tin, copper or gold.

Substrate 12 is subjected to a singulation process which separates units 19 and 21 from one another, and thus forms individual board-on-chip packages from units 19 and 21. The singulation process can include, for example, cutting through encapsulant 42 and substrate 12.

A problem which can be associated with board-on-chip packages is that the chip can heat during use. The heating can damage electrical components associated with the chip. It would be desirable to develop alternative board-on-chip packages which alleviate such heating.

SUMMARY OF THE INVENTION

In one aspect, the invention encompasses a board-on-chip package comprising an insulative substrate having circuitry thereon and an opening therethrough. A semiconductive-material-comprising die is adhered to the substrate and electrically connected to the circuitry with a plurality of electrical interconnects extending through the opening. A metal foil is in physical contact with at least a portion of the die.

In another aspect, the invention encompasses another embodiment board-on-chip package comprising an insulative substrate having circuitry thereon and an opening therethrough. A semiconductive-material-comprising die is adhered to the substrate and electrically connected to the circuitry with a plurality of electrical interconnects extending through the opening. The die has a first surface facing the substrate and a second surface in opposing relation to the first surface. The die further comprises a sidewall surface extending between the first and second surfaces. A thermally conductive material is in physical contact with at least one of the die first surface, second surface and sidewall surface. The thermally conductive material has a thermal conductivity under specified conditions equal to or greater than the conductivity of elemental copper under the same specified conditions.

In yet another aspect, the invention encompasses a method of forming a plurality of board-on-chip packages. An insulative substrate is provided. Such substrate has a repeating circuitry pattern thereon, and a plurality of openings therethrough. The openings are in a one-to-one correspondence with individual of the repeated circuitry patterns. A plurality of semiconductive-material-comprising dies are adhered to the substrate. Circuitry supported by the dies is electrically connected with the circuitry on the substrate utilizing a plurality of electrical interconnects extending through the openings. A metal foil is joined to the substrate and extended over the plurality of dies. The substrate and metal foil are cut to form singulated die packages comprising a single die, a portion of the substrate having a single repeated pattern of the circuitry, and a portion of the metal foil.

BRIEF DESCRIPTION OF THE DRAWINGS

Preferred embodiments of the invention are described below with reference to the following accompanying drawings.

FIG. 13 is a diagrammatic, cross-sectional view of a portion of a semiconductor assembly at a preliminary step of a method encompassed by the present invention.

FIG. 14 is a view of the FIG. 13 assembly portion shown at a processing step subsequent to that of FIG. 13.

FIG. 16 is a cross-sectional side view of the FIG. 14 assembly portion shown after singulation of units encompassed by the FIG. 14 assembly portion.

FIG. 17 is a diagrammatic, cross-sectional view of a semiconductor assembly processed according to another embodiment method of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
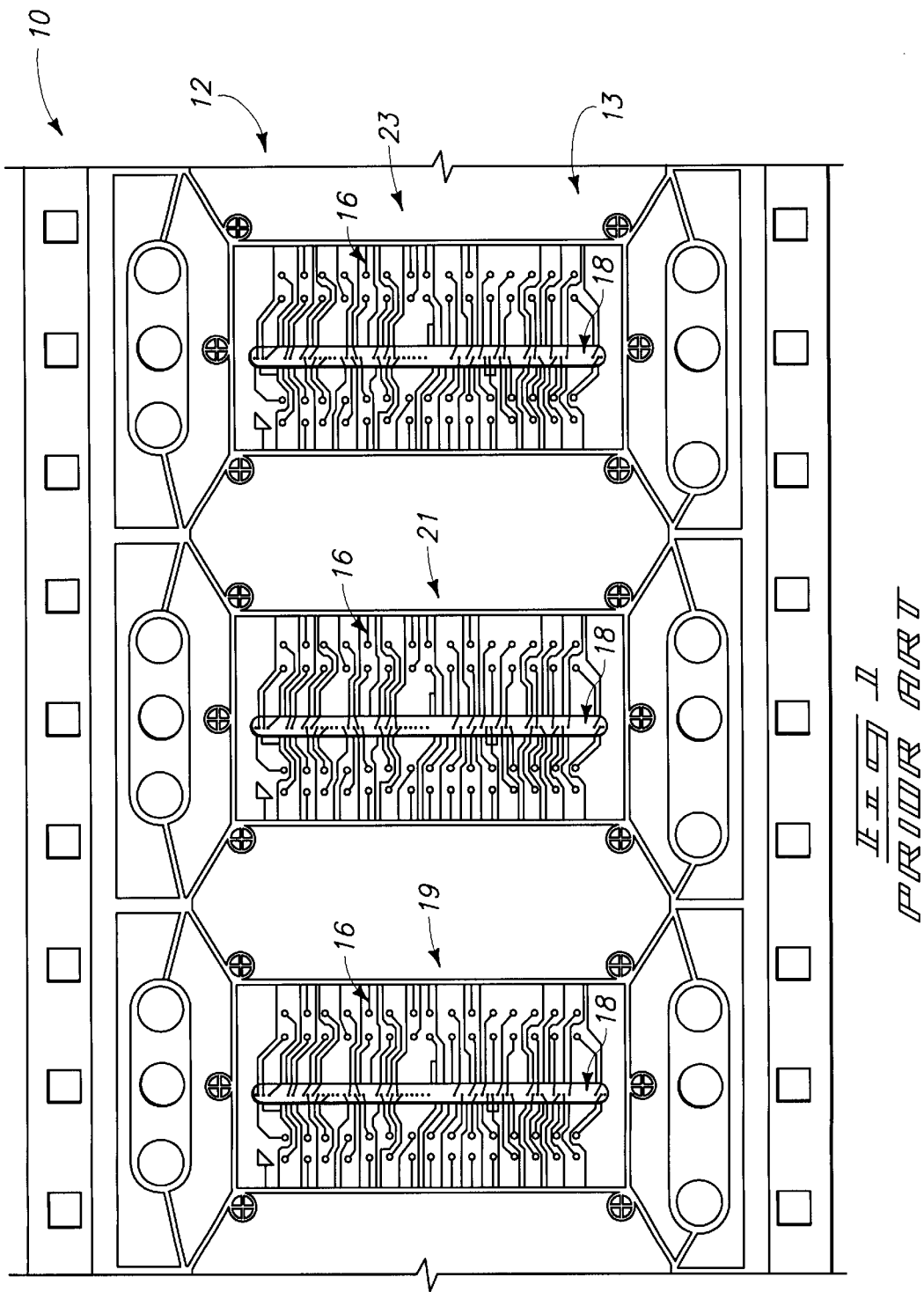
FIG. 1 is a diagrammatic, fragmentary view of a prior art semiconductor assembly at a preliminary step of a die package forming process.
Figure 2:
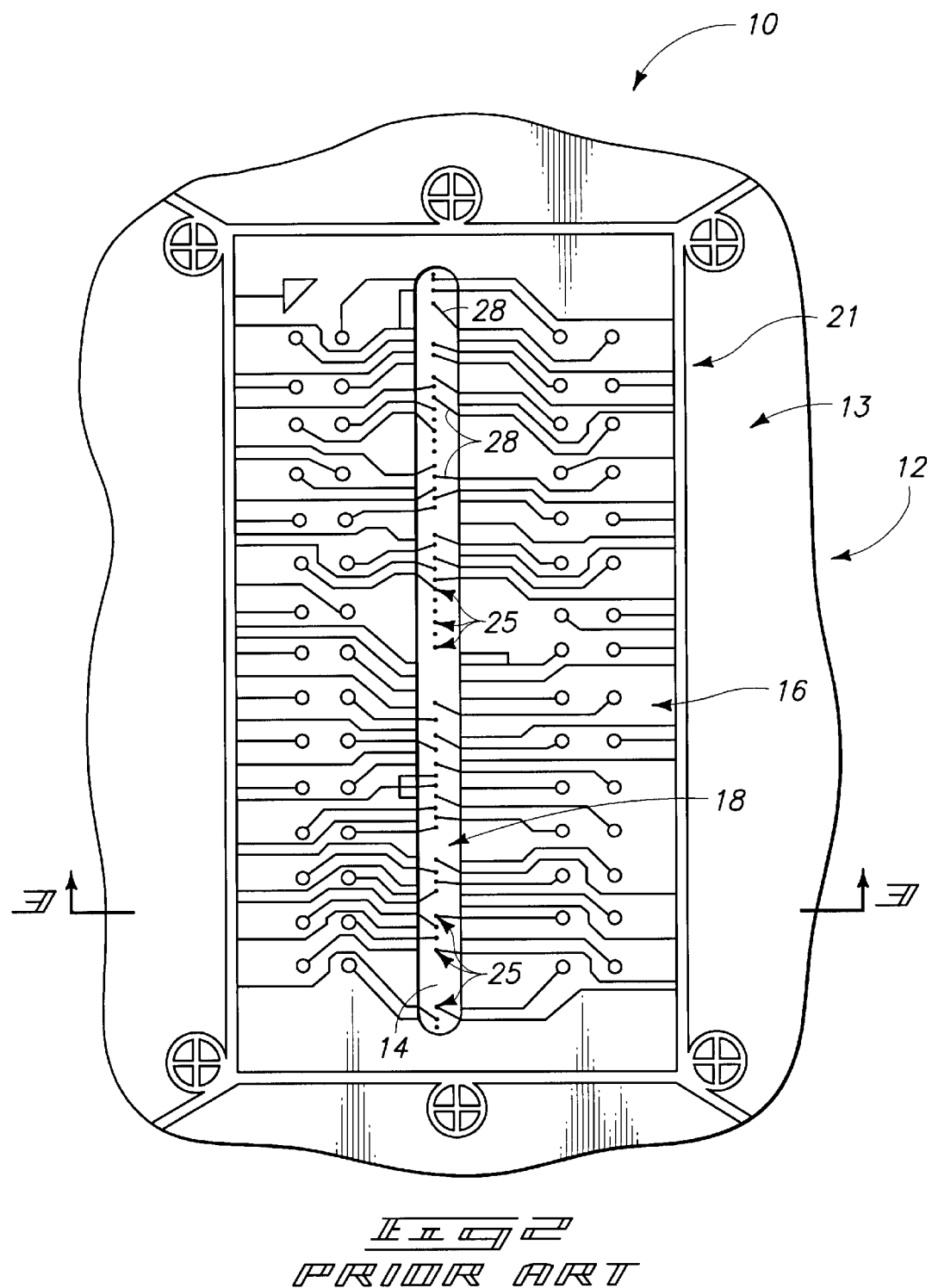
FIG. 2 is an expanded view of a portion of the FIG. 1 assembly.
Figure 3:
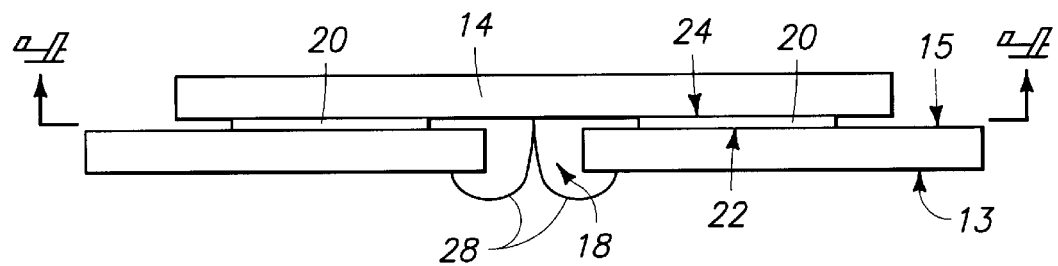
FIG. 3 is a cross-sectional view along the line 3—3 of FIG. 2.
Figure 4:
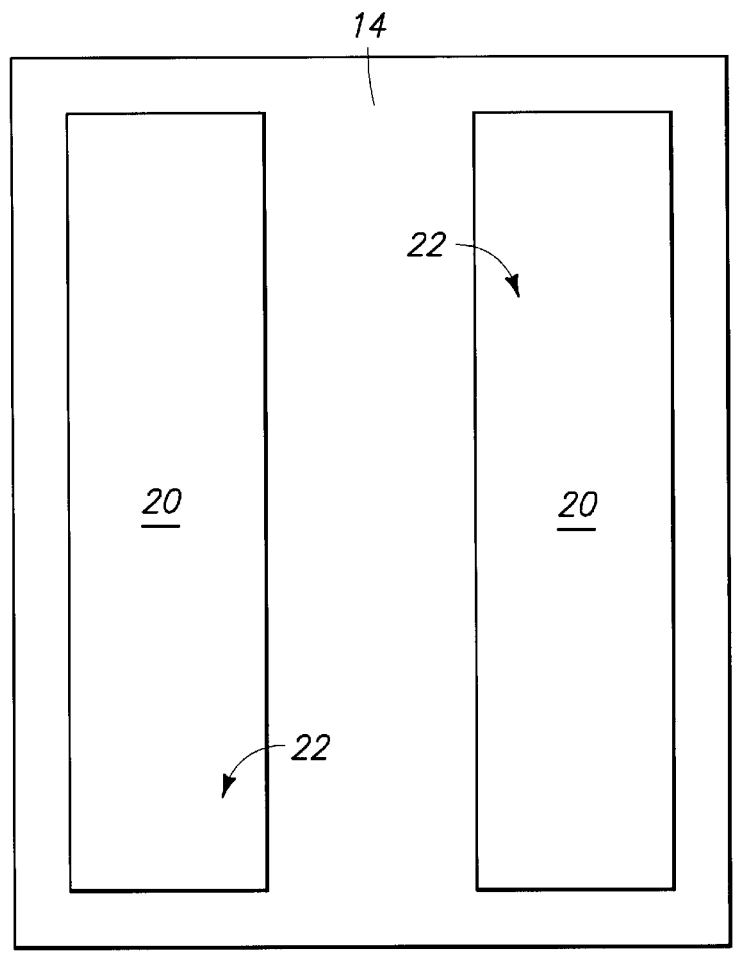
FIG. 4 is a cross-sectional view along the line 4—4 of FIG. 3.
Figure 6:
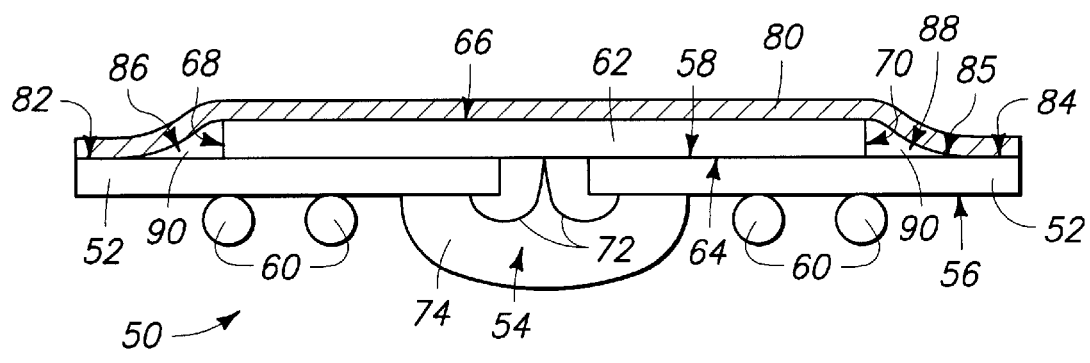
FIG. 6 is a diagrammatic, cross-sectional view of a semiconductor assembly encompassed by the present invention.

A semiconductor assembly encompassed by the present invention is illustrated as assembly 50 in FIG. 6. Assembly 50 comprises an insulative substrate 52 having an opening (or slit) 54 extending therethrough. Substrate 52 comprises a first surface 56 and a second surface 58 in opposing relation to first surface 56. Circuitry (such as, for example, the circuitry 16 described with reference to prior art FIG. 1) can be formed over first surface 56. Substrate 52 can accordingly comprise a substrate identical to that described as substrate 12 with reference to FIG. 1 of the prior art. In particular embodiments, substrate 52 can comprise a printed circuit board, such as, for example, either a board of the type known as FR-4 in the art, or of the type known as BCB in the art.

Figure 5:
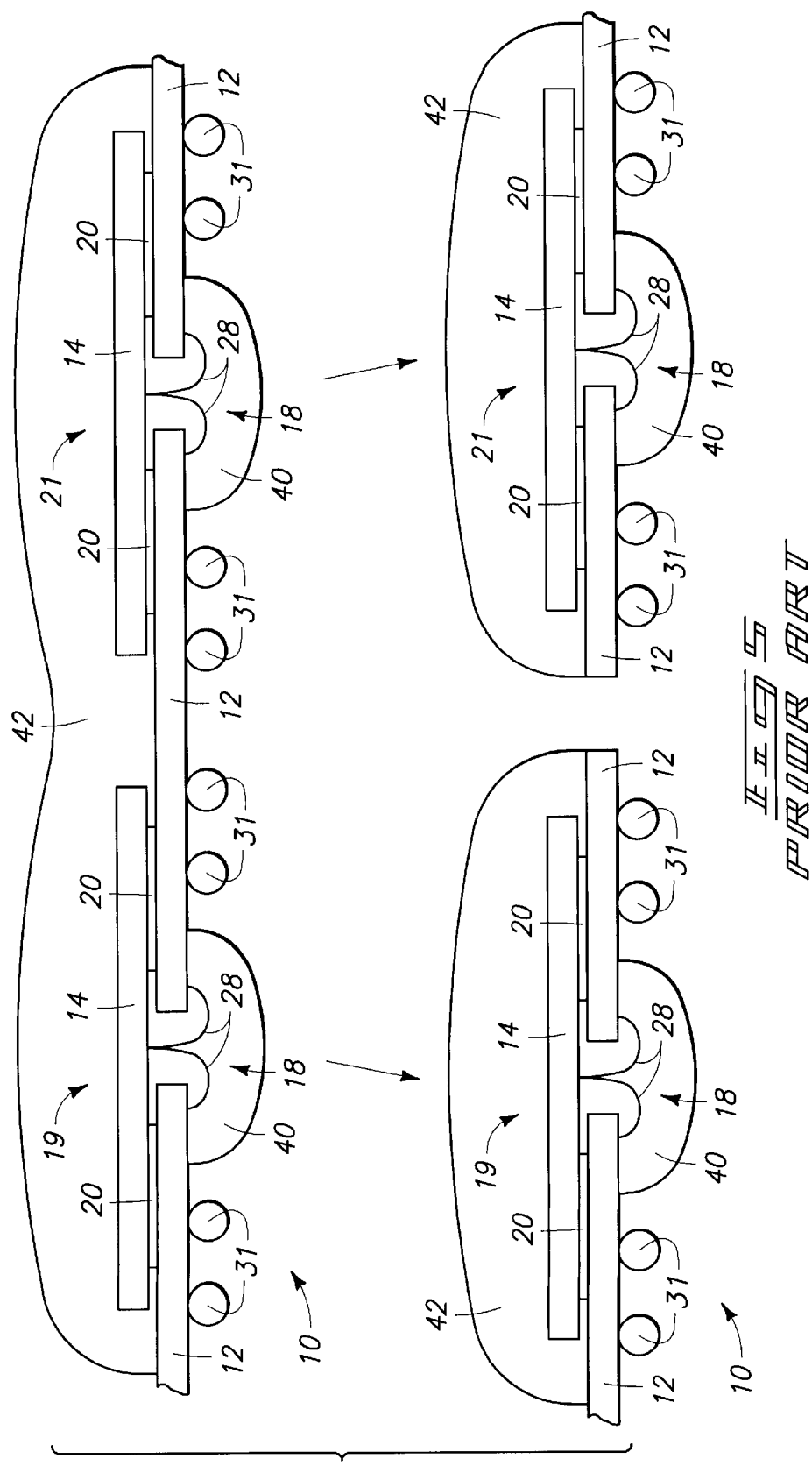
FIG. 5 is a view of a portion of the FIG. 1 assembly shown being subjected to prior art processing subsequent to that of FIGS. 1–3.

Conductive balls 60 are formed over first surface 56 of substrate 52, and can comprise, for example, materials of the type described for prior art conductive balls 31 with reference to FIG. 5.

A semiconductive-material-comprising die (or chip) 62 is adhered to second surface 58 of substrate 52. Chip 62 comprises a first surface 64 aligned to face toward second surface 58 of substrate 52. Chip 62 further comprises a second surface 66 aligned to face away from second surface 58 of substrate 52. Additionally, chip 62 comprises a first sidewall surface 68 and a second sidewall surface 70 in opposing relation to first sidewall surface 68, with sidewall surfaces 68 and 70 extending between the surfaces 64 and 66. Chip 62 can comprise a construction identical to that described above for chip 14 of the prior art.

Electrical interconnects 72 extend from chip 62, through opening 54, and to the circuitry (not shown) on first surface 56 of substrate 52. Interconnects 72 can comprise wire bonds identical to the wire bonds 28 described above with reference to prior art FIGS. 1–5.

An encapsulant 74 is formed over electrical interconnects 72 and within opening 54. Encapsulant 74 can comprise materials identical to those described for encapsulant 40 of the prior art.

A thermally conductive material 80 is formed over substrate 52 and chip 62. Material 80 preferably has a thermal conductivity greater than or equal to that of elemental copper (with thermal conductivity being defined as the heat (in calories) transmitted per second through a plate 1 cm thick by about 1 cm$^2$ utilizing a temperature differential of about 1° C., the thermal conductivity of elemental copper being understood to be about 1 calorie). The thermally conductive material 80 can improve dissipation of heat from chip 62 relative to prior art board-on-chip constructions, and can thus alleviate problems associated with chip heating.

In preferred embodiments, material 80 is a metal foil or conductive epoxy in physical contact with at least a portion of chip 62. Material 80 can comprise, for example, a metal foil selected from the group consisting of copper foil and aluminum foil. Alternatively, material 80 can comprise, for example, a silver-filled epoxy. For purposes of interpreting this disclosure and the claims that follow, a metal "foil" is to be understood as a metal sheet that is less than or equal to about 500 microns thick.

In the shown embodiment, thermally conductive material 80 contacts substrate 52 at a first location 82 proximate first sidewall 68, and at a second location 84 proximate second sidewall 70. Thermally conductive material 80 extends across the first and second sidewalls and over second die surface 66, and is separated from first and second sidewalls 68 and 70 by gaps 86 and 88, respectively. A material 90 is provided within gaps 86 and 88 to adhere thermally conductive material 80 to substrate 52. In the shown embodiment, gaps 86 and 88 are predominately filled (actually entirely filled) with thermally conductive material 90. Material 90 can comprise, for example, an epoxy, and preferably comprises an electrically conductive epoxy (such as, for example, a silver-filled epoxy). A reason for utilizing the electrically conductive epoxy is that electrically conductive materials are frequently also thermally conductive and accordingly the electrically conductive epoxy can help to dissociate heat from chip 62. It is to be understood, however, that material 90 can comprise an insulative material, and in particular embodiments can comprise a gas, such as, for example, air.

It is noted that among the differences of the embodiment of FIG. 6 relative to the prior art (such as, for example, the construction shown in FIG. 3) is that tape 20 (FIG. 3) is eliminated in the embodiment of FIG. 6. Instead, chip 62 is adhered directly to substrate 52. Such adhering of chip 62 directly to substrate 52 can be accomplished by, for example, providing and curing an electrically conductive epoxy between surface 64 of chip 62 and surface 58 of substrate 52. Of course, tape (such as, for example, that shown in FIG. 3) can also be utilized to adhere chip 62 with substrate 52 in embodiments of the present invention.

Figure 7:
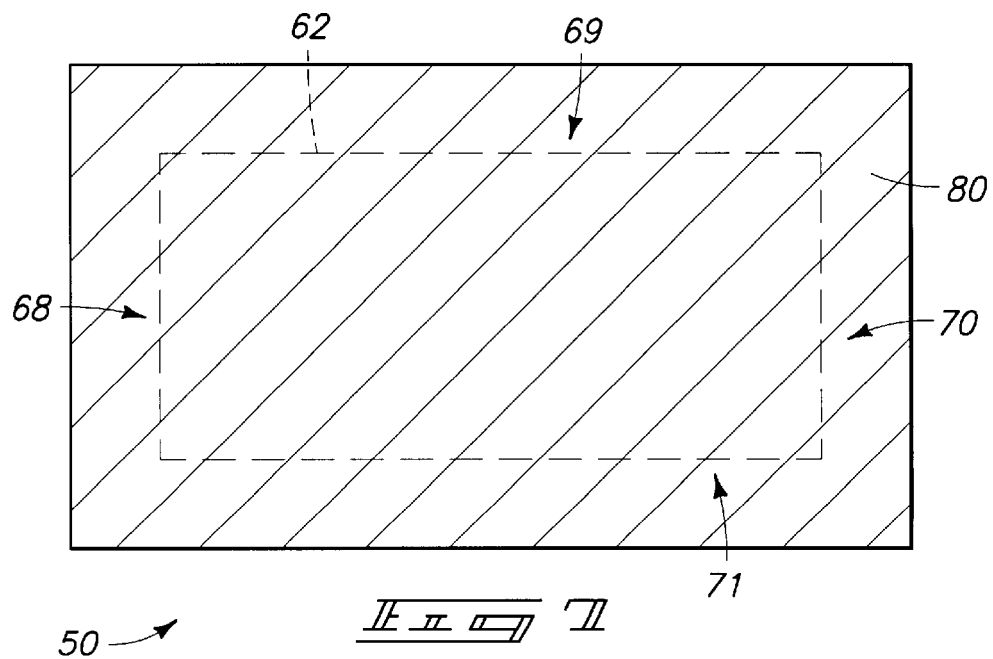
FIG. 7 is a top view of the FIG. 6 structure.

FIG. 7 shows a top view of assembly 50, and shows that thermally conductive material 80 contacts an entirety of second surface 66 of die 62, with die 62 being illustrated in phantom view beneath thermally conductive material 80. In the shown configuration, die 62 comprises a rectangular outer periphery having four sides (68, 70, 69 and 71), and conductive material 80 extends outwardly beyond the outer periphery of the die and contacts substrate 52 (FIG. 6) at locations proximate each of the four sides.

Referring again to FIG. 6, it is noted that thermally conductive material 80 comprises a bend in extending from surface 58 of substrate 52 to surface 66 of die 62. Because thermally conductive material 80 comprises such bend, it can be advantageous to utilize flexible materials, such as, for example, thin thermally conductive foils for the thermally conductive material 80. A preferred thickness of a metal foil utilized for thermally conductive material 80 is from about 100 microns to about 800 microns, with from about 150 microns to about 400 microns being more preferred. Of course, the invention encompasses embodiments in which material 80 does not flex, and in such embodiments it can be advantageous to utilize a material 80 having a thickness greater than 800 microns.

A second embodiment assembly of the present invention is described with reference to FIG. 8. In referring to FIG. 8, similar numbering will be utilized as was used above in describing the embodiment of FIG. 6 with the suffix "a" used to indicate structures shown in FIG. 8.

Figure 8:
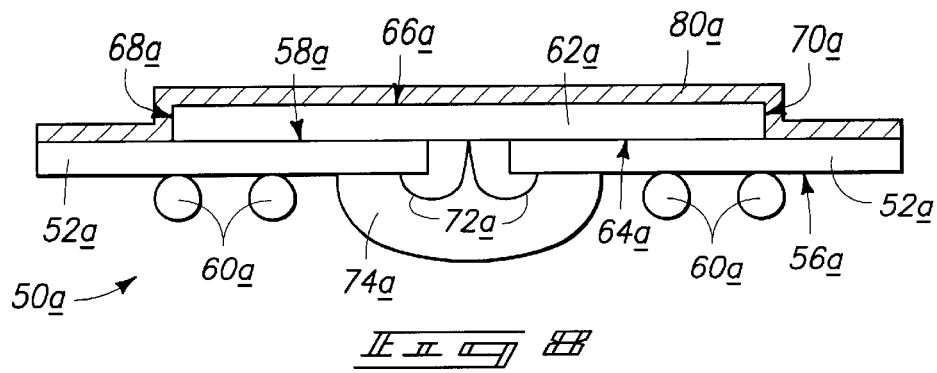
FIG. 8 is a diagrammatic, cross-sectional view of a second embodiment semiconductor assembly encompassed by the present invention.

Referring to FIG. 8, an assembly 50a comprises an insulative substrate 52a, and a chip 62a. Chip 62a comprises sidewalls 68a and 70a. A thermally conductive material 80a is formed over chip 62a and substrate 52a. The thermally conductive material 80a of FIG. 8 can comprise, for example, a metal foil, and can be adhered to substrate 52a and chip 62a with conductive epoxy provided between the metal foil and surfaces of the chip and substrate.

Assembly 50a is similar to the assembly 50 of FIG. 6, except that the thermally conductive material 80a contacts a predominant portion of the sidewalls 68a and 70a of chip 62a, whereas thermally conductive material 80 of the FIG. 6 assembly was separated from the predominant portion of chip sidewalls 68 and 70 by gaps 86 and 88. It is noted that the sidewalls 68a and 70a of FIG. 8 comprise respective lengths corresponding to the distance between chip surface 64a and chip surface 66a, and that in the shown embodiment thermally conductive material 80a contacts an entirety of such lengths of sidewalls 68a and 70a.

A third embodiment semiconductor assembly encompassed by the present invention is described with reference to FIG. 9. In referring to FIG. 9, similar numbering will be utilized as was used above in describing FIG. 6, with the suffix "b" used to indicate structures shown in FIG. 9.

Figure 9:
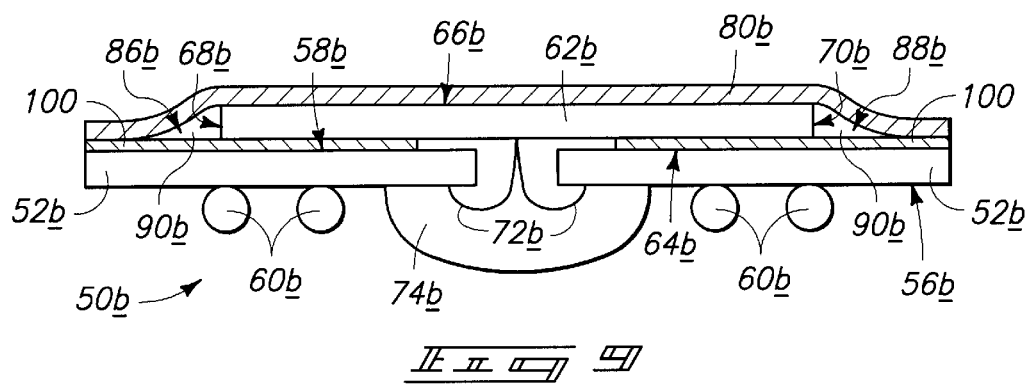
FIG. 9 is a diagrammatic, cross-sectional view of a third embodiment semiconductor assembly encompassed by the present invention.

FIG. 9 shows an assembly 50b comprising a substrate 52b and a semiconductive-material-comprising chip 62b over substrate 52b. Chip 62b comprises a first surface 64b aligned to face substrate 52b. Chip 62b also comprises a second surface 66b in opposing relation relative to first surface 64b, and accordingly aligned to face away from substrate 52b. Chip 62b further comprises opposing sidewalls 68b and 70b which extend between surfaces 64b and 66b.

A first thermally conductive material 80b extends over chip 62b and substrate 52b. First thermally conductive material 80b can comprise identical constructions as described above for material 80, and accordingly could comprise, for example, a thin metal foil.

A second thermally conductive material 100 extends over substrate 52b and under chip 62b. Second thermally conductive material 100 can comprise an identical construction as first material 80b, or a different construction. In preferred embodiments, thermally conductive material 100 and thermally conductive material 80b will both comprise thin metal foils. In other embodiments, thermally conductive materials 100 and 80b can both comprise, for example, electrically conductive epoxies, such as, for example, silver filled epoxies.

Thermally conductive material 80b is separated from sidewalls 68b and 70b of chip 62b by gaps 86b and 88b. Such gaps can be left void of conductive materials, or can be filled with a thermally conductive material 90b as shown. Such thermally conductive material can comprise, for example, an electrically conductive epoxy.

A fourth embodiment assembly of the present invention is described with reference to FIG. 10. In referring to FIG. 10, similar numbering will be utilized as was used above in describing the embodiment of FIG. 9, with the suffix "c" used to indicate structures pertaining to FIG. 10.

Figure 10:
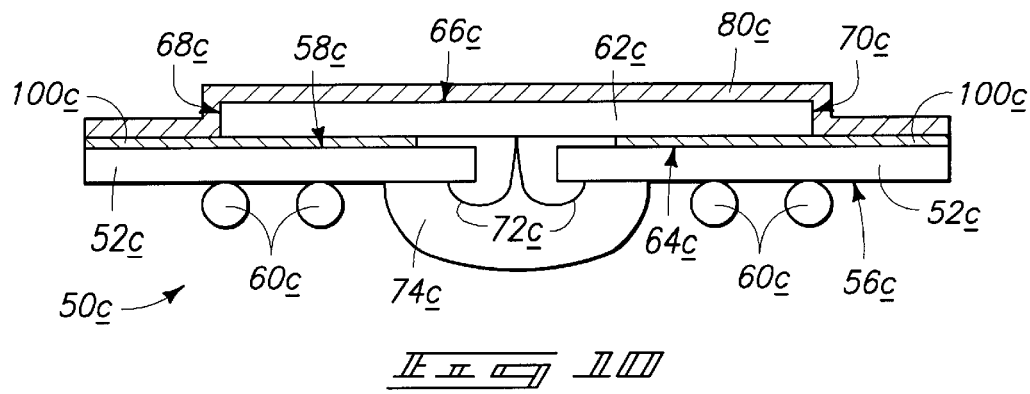
FIG. 10 is a diagrammatic, cross-sectional view of a fourth embodiment semiconductor assembly encompassed by the present invention.

FIG. 10 shows an assembly 50c comprising a chip 62c, a substrate 52c, a first thermally conductive material 100c and a second thermally conductive material 80c. The assembly of FIG. 10 is similar to the assembly of FIG. 9 except that thermally conductive material 80c contacts a predominant portion of the sidewalls of chip 62c, whereas the thermally conductive material 80b of FIG. 9 was spaced from a predominant portion of the sidewalls of chip 62b.

A fifth embodiment of the present invention is described with reference to FIG. 11. In referring to FIG. 11, similar numbering will be used as was utilized above in describing the embodiment of FIG. 6, with the suffix "d" used to indicate structures shown in FIG. 11.

Figure 11:
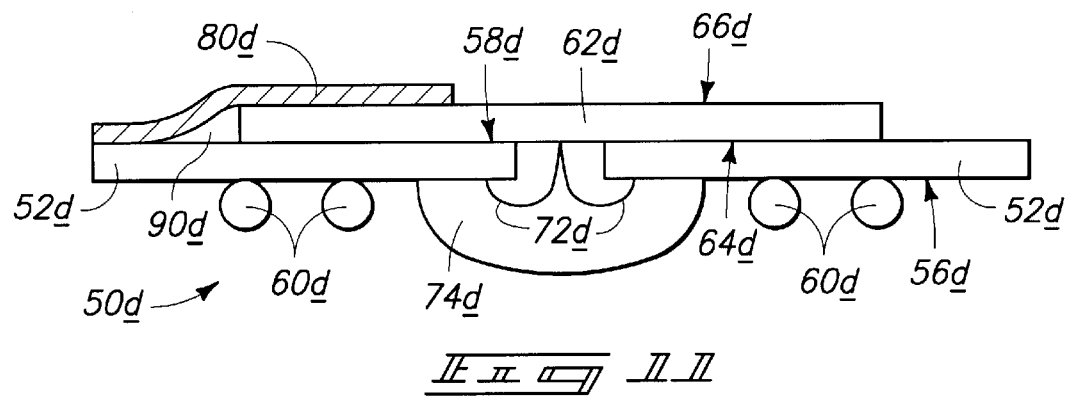
FIG. 11 is a diagrammatic, cross-sectional view of a fifth embodiment semiconductor assembly encompassed by the present invention.

An assembly 50d is illustrated in FIG. 11, and such comprises a chip 62d over a substrate 52d. Chip 62d comprises a first surface 64d facing substrate 52d, and a second surface 66d in opposing relation relative to first surface 64d. A thermally conductive material 80d extends over substrate 52d and over a portion of chip 62d. However, in contrast to the thermally conductive materials of FIGS. 6–10, thermally conductive material 80d contacts only a portion of the second surface 66d of chip 62d. In the shown embodiment, thermally conductive material 80d does not even cover a predominant portion (i.e., half) of second surface 66d. A prior art encapsulant (such as the encapsulant labeled 42 in FIG. 5) can be provided over uncovered portions of substrate 52d and chip 62d.

A sixth embodiment of the invention is described with reference to FIG. 12. In referring to FIG. 12, similar numbering will be utilized as was used above in describing the embodiment of FIG. 6, with the suffix "e" used to indicate structures shown in FIG. 12.

Figure 12:
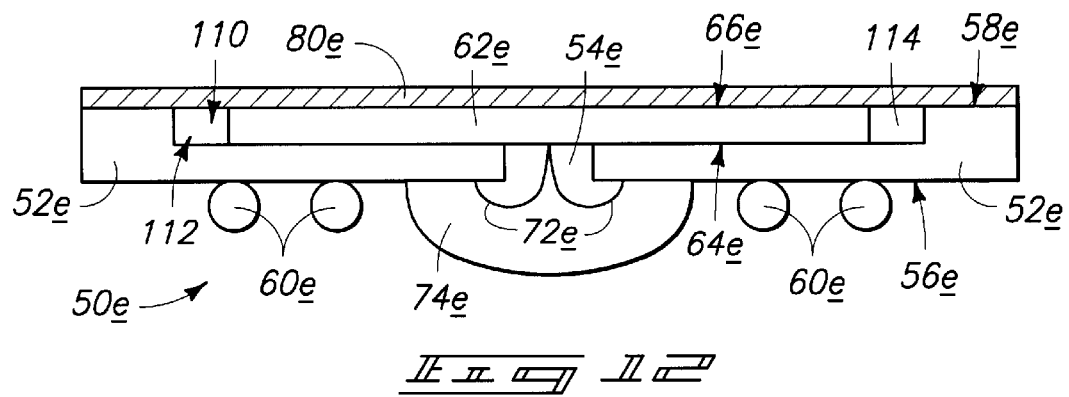
FIG. 12 is a diagrammatic, cross-sectional view of a sixth embodiment semiconductor assembly encompassed by the present invention.

FIG. 12 illustrates an assembly 50e comprising an insulative substrate 52e and a semiconductive-material-comprising chip 62e. Substrate 52e comprises a first surface 56e having circuitry (not shown) formed thereon and a second surface 58e in opposing relation relative to first surface 56e. A slit 54e extends through substrate 52e, and a cavity 110 is formed within second surface 58e and proximate slit 54e. Chip 62e is received within cavity 110. Chip 62e comprises a first (or inner) surface 64e facing substrate 52e and a second (or outer) surface 66e in opposing relation relative to first surface 64e. A thermally conductive material 80e extends over chip 62e and substrate 52e. Thermally conductive material 80e can comprise, for example, a metal foil. It is noted that thermally conductive material 80e is not flexed over sidewalls of chip 62e (compare the embodiments of FIGS. 6–11). Accordingly, thermally conductive material 80e can be formed of relatively non-flexible materials without adversely affecting processing utilized to form assembly 50e. Thermally conductive material 80e can thus comprise a sheet of thermally conductive material having a thickness of greater than about 800 microns, as well as comprising relatively flexible foils having thicknesses of less than about 800 microns. The thermally conductive material utilized for sheet 80e can be selected from the group consisting of copper and aluminum. In the shown embodiment, chip 62e is received entirely within cavity 110 and thermally conductive material 80e extends over cavity 110 to enclose chip 62e within the cavity. In other embodiments (not shown) chip 62e can have a portion extending outwardly of the cavity.

Chip 62e and sheet 80e can be adhered to one another, as well as to substrate 52e utilizing, for example, an electrically conductive epoxy. In the shown embodiment, the sidewalls of chip 62e are separated from substrate 52e by gaps 112 and 114. Such gaps can be left open, or can be filled with a material, such as, for example, a thermally conductive material. The thermally conductive material can comprise an electrically conductive epoxy, such as, for example, silver-filled epoxy.

Referring to FIGS. 13–16, a method of forming an assembly of the present invention is described. In referring to FIGS. 13–16, similar numbering will be used as was utilized above in describing the embodiment of FIG. 6, with the suffix "f" used to indicate structures shown in FIGS. 13–16.

Referring first to FIG. 13, a portion of an assembly 200 is illustrated at a preliminary step of the described process. Assembly 200 comprises an insulative substrate 52f and a plurality of chips 62f formed over substrate 52f. Substrate 52f can comprise, for example, the prior art substrate 12 described with reference to FIG. 1.

A plurality of slits 54f extend through substrate 52f. Circuitry (not shown) is on a first surface 56f of substrate 52f. Such circuitry can correspond to, for example, the circuitry 16 of FIG. 1, and accordingly can be formed in a repeating pattern, with the pattern having a one-to-one correspondence with slits 54f. Chips 62f are electrically connected with the circuitry on surface 56f with electrical interconnects 72f. Conductive balls 60f are also associated with the circuitry on surface 56f. Encapsulant 74f is formed over electrical interconnects 72f and within gaps 54f.

A thermally conductive material 80f (preferably a metal foil) is formed over substrate 52f and chips 62f. Metal foil 80f is adhered to one or both of substrate 52f and chips 62f. Foil 80f can be adhered by, for example, utilizing an adhesive to bond foil 80f to chips 62f and substrate 52f. An alternate method of adhering foil 80f to substrate 52f is to melt a portion of foil 80f together with a portion of substrate 52f. Such melting can be accomplished by, for example, directing a laser light 210 on the portions which are to be melted. The light can heat a localized region of metal foil 80f together with a localized region of substrate 52f. The melted materials of foil 80f and substrate 52f can be subsequently cooled to effectively weld foil 80f to substrate 52f. Although the laser light 210 is shown being applied in a direction which impacts foil 80f instead of substrate 52f, it is to be understood that the laser light could be applied from an opposite direction (i.e., from a direction whereupon the light impinges upon substrate 52f rather than metal foil 80f), or from both directions simultaneously.

The chips 62f of assembly 200 are separated from one another by gaps 220, and metal foil 80f extends over gaps 220. Referring to FIG. 14, metal foil 80f is bent downwardly into gaps 220 to cause foil 80f to contact substrate 52f within gaps 220. In the shown embodiment wherein foil 80f is bonded to substrate 52f prior to being inserted within gaps 220, there is preferably an excess of foil provided between the bonded portions to provide enough material 80f to accommodate the bends formed in gaps 220. In alternative embodiments, 23 material 80f can be bent into gaps 220 before the material is bonded to either substrate 52f or chips 62f.

After material 80f is bent into gaps 220, material 80f is preferably adhered to substrate 52f within gaps 220. Such can be accomplished by, for example, utilizing laser light 210 as shown in FIG. 14. Alternatively, such can be accomplished by providing an adhesive over substrate 52 within gaps 220 to adhere foil 80f to substrate 52f.

Figure 15:
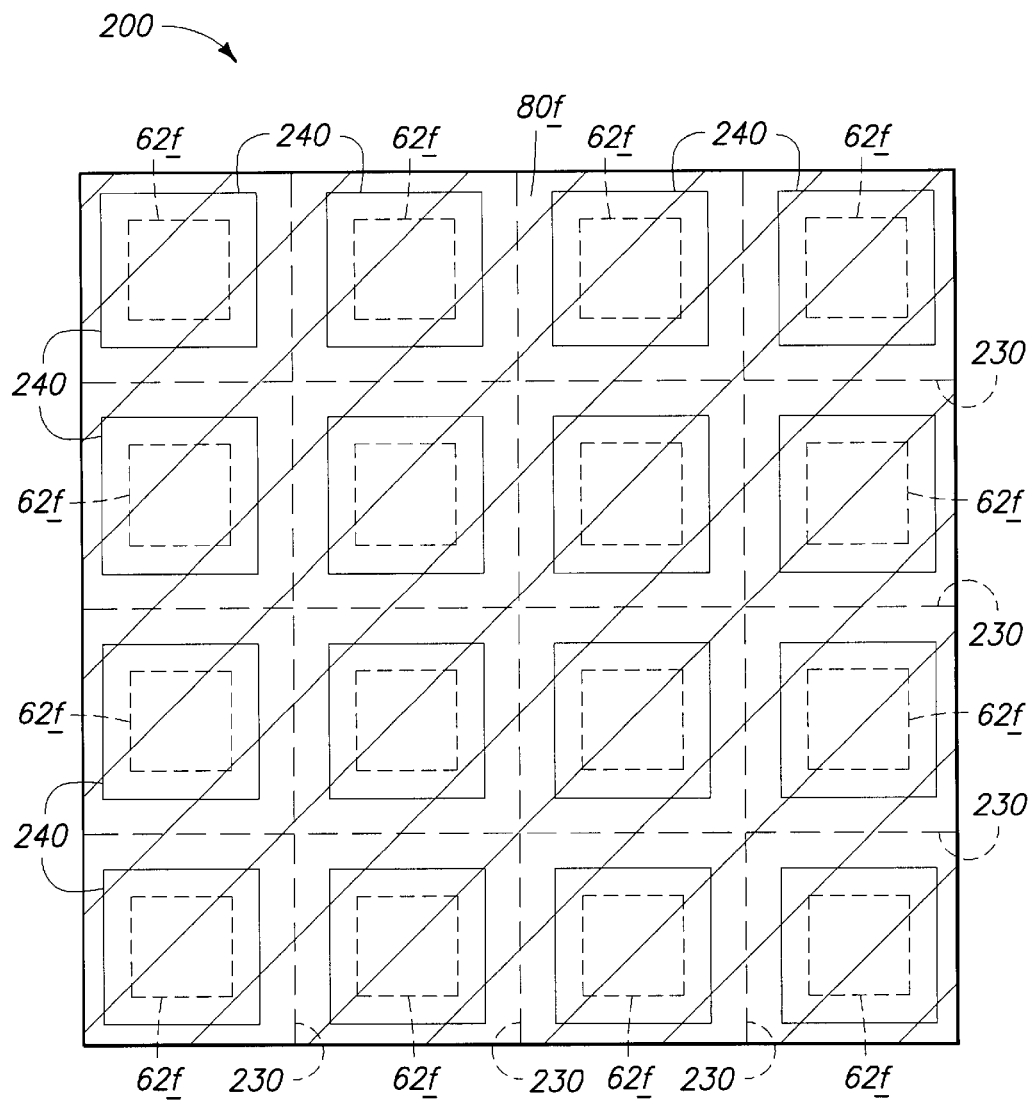
FIG. 15 is a top view of the assembly comprising the FIG. 14 portion.

FIG. 15 is a top view of the assembly 200 which comprises the portion shown in FIG. 14. Such view shows that assembly 200 comprises a square panel having 16 repeating patterns (i.e., four repeating patterns on each side of the square panel). The panel can comprise a size of, for example, from about 8"×8" to about 12"×12", such as, for example, a size of about 10"×10". Chips 62f are shown in phantom view in FIG. 15. Also shown in FIG. 15 are dashed lines 230 corresponding to locations wherein assembly 200 is cut to form singulated die packages (i.e., singulated board-on-chip packages). FIG. 15 further shows solid lines 240 corresponding to locations wherein thermally conductive material 80f is adhered to underlying substrate 52f (FIG. 14).

Referring to FIG. 16, the portion of assembly 200 of FIG. 14 is shown after such portion is subjected to a cutting process which separates substrate 52f into three singulated assemblies 250, 252 and 254.

The embodiment described with reference to FIGS. 13–16 is merely an exemplary embodiment for forming assemblies of the present invention. It is to be understood that the invention encompasses other methods of forming such assemblies. For instance, some of the steps shown in FIGS. 13–16 can be done in an order other than that described with reference to FIGS. 13–16. As an example, encapsulant 74f and wire balls 60f can be provided after the bending of metal foil 80f within gaps 220. As another example, metal foil 80f can be bonded to at least portions of substrate 52f during or after the cutting described with reference to FIG. 16.

Another method of the present invention is described with reference to FIGS. 17 and 18. In referring to FIGS. 17 and 18, similar numbering will be utilized as was used above in describing FIG. 6, with the suffix "g" used to indicate structures shown in FIGS. 17 and 18.

FIG. 17 shows an assembly 50g at an initial step of the method. Assembly 50g comprises a substrate 52g having a first surface 56g and a second surface 58g in opposing relation relative to surface 56g. Circuitry (not shown) is formed on surface 56g. Such circuitry can comprise, for example, the circuitry 16 described with reference to prior art FIG. 1. A thermally conductive material 80g is formed over surface 58g of substrate 52g, and can be adhered to substrate 52g utilizing, for example, a conductive epoxy.

Thermally conductive material 80g preferably comprises a flexible material, such as, for example, a metal foil. Such metal foil can be selected from the group consisting of aluminum foil and copper foil.

An opening 54g extends through thermally conductive material 80g and substrate 52g. A semiconductive-material-comprising chip 62g is provided over thermally conductive material 80g and across opening 54g. Chip 62g comprises a first surface 64g which faces substrate 52g and a second surface 66g in opposing relation relative to first surface 64g. Chip 62g further comprises sidewalls 68g and 70g. Chip 62g can be adhered to thermally conductive material 80g utilizing conductive epoxy. Conductive interconnects 72g extend through opening 54g and electrically connect chip 62g with the circuitry formed on surface 56g of substrate 52g.

Figure 18:
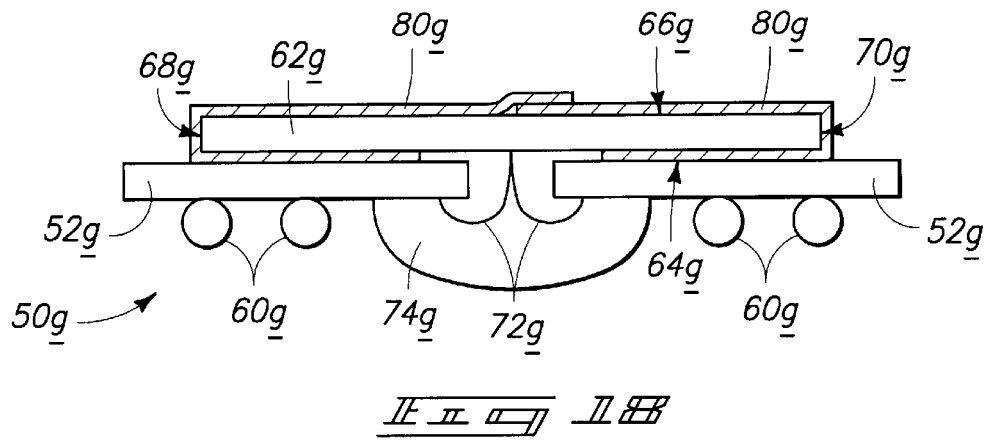
FIG. 18 is a view of the FIG. 17 assembly shown at a processing step subsequent to that of FIG. 17.

Referring to FIG. 18, thermally conductive material 80g is wrapped around chip 62g. In the shown embodiment, thermally conductive material 80g is provided to be of sufficient length such that the conductive material overlaps over second surface 66g of chip 62g.

Figure 19:
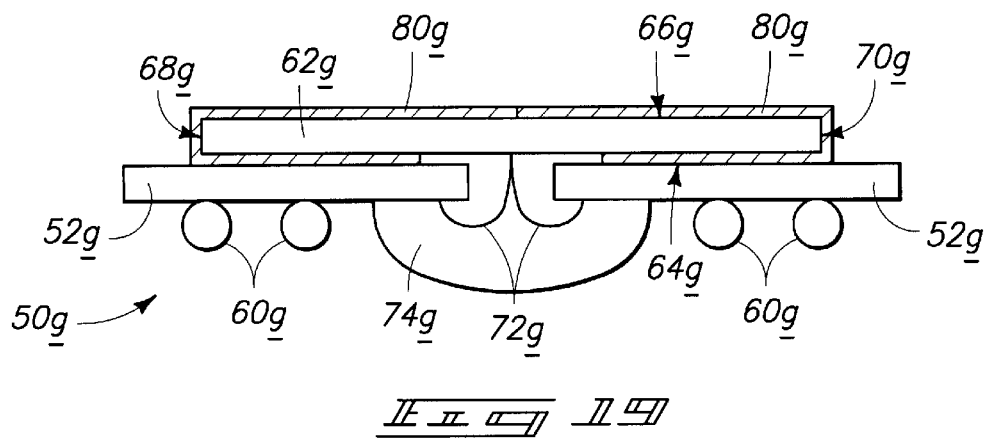
FIG. 19 is a view of a semiconductor assembly formed in accordance with another method encompassed by the present invention.
Figure 20:
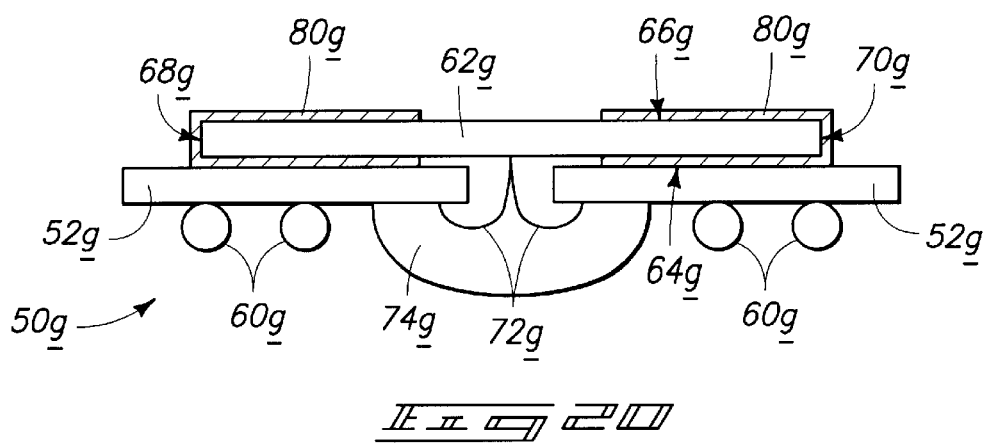
FIG. 20 is a view of a semiconductor assembly formed in accordance with yet another embodiment method encompassed by the present invention.

FIGS. 19 and 20 illustrate alternative assemblies 50g which can be formed utilizing thermally conductive material 80g with differing lengths. Specifically, FIG. 19 illustrates an assembly 50g which results from utilization of a material 80g having a length such that the material forms a butt joint over surface 66g of chip 62g. FIG. 20 illustrates an embodiment wherein thermally conductive material 80g is of a length such that the material leaves a portion of surface 66g uncovered. A prior art encapsulant can be formed over the uncovered portion.

The methods and apparatuses described in FIGS. 17–20 are merely exemplary methods and apparatuses. The invention, of course, encompasses other methods and apparatuses. For instance, although the thermally conductive material 80g is shown formed against and along sidewalls 68g and 70g of chip 62g, it is to be understood that gaps analogous to the gaps 86 and 88 of FIG. 6 could be left between the sidewalls and the thermally conductive material. Also, it is to be understood that materials shown in FIGS. 17 and 18 could be provided after the processing of the conductive material 80g described with reference to FIGS. 17 and 18. For instance, one or more of the encapsulant 74g, interconnect 72g, and conductive balls 60g could be provided after the processing of conductive material 80g of FIGS. 17 and 18, rather than before such processing. Further, although the processing in FIGS. 17–20 shows thermally conductive material 80g initially provided on both sides of slit 54g, it is to be understood that the material could be initially provided on only one side of the slit and wrapped either partially or entirely around surfaces 66g, 68g and 70g of chip 62g.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A board on chip package, comprising:
   an insulative substrate having circuitry thereon and an opening therethrough;
   a semiconductive-material-comprising die adhered to the substrate and electrically connected to the circuitry with a plurality of electrical interconnects extending through the opening;
   a metal foil in physical contact with at least a portion of the die; and
   wherein the foil is adhered to the substrate with an electrically conductive epoxy.

2. The board on chip package of claim 1 wherein the die has a first surface facing the substrate and a second surface in opposing relation to the first surface, the foil being in physical contact with an entirety of said second surface.

3. The board on chip package of claim 1 wherein the metal foil is selected from the group consisting of copper foil and aluminum foil.

4. The board on chip package of claim 1 wherein the die is adhered to the substrate with an electrically conductive epoxy.

5. A board on chip package, comprising:
   an insulative substrate having circuitry thereon and an opening therethrough;
   a semiconductive-material-comprising die adhered to the substrate and electrically connected to the circuitry with a plurality of electrical interconnects extending through the opening;
   a metal foil in physical contact with at least a portion of the die; and
   wherein the die has a first surface facing the substrate and a second surface in opposing relation to the first surface, the foil being in physical contact with only a portion of said second surface, but not the whole surface.

6. A board on chip package, comprising:
   an insulative substrate having circuitry thereon and an opening therethrough;
   a semiconductive-material-comprising die adhered to the substrate and electrically connected to the circuitry with a plurality of electrical interconnects extending through the opening;
   a metal foil in physical contact with at least a portion of the die; and
   wherein the die has a first surface facing the substrate, a second surface in opposing relation to the first surface, and a sidewall between the first and second surfaces, the foil being adhered to the substrate proximate the sidewall and extending across the sidewall to physically contact the second surface.

7. The board on chip package of claim 6 wherein the sidewall has a length, and wherein the foil physically contacts a predominate portion of the sidewall length.

8. The board on chip package of claim 6 wherein the sidewall has a length, and wherein the foil is spaced from a predominate portion of the sidewall length by a gap.

9. The board on chip package of claim 6 wherein the sidewall has a length, wherein the foil is spaced from a predominate portion of the sidewall length by a gap, and wherein the gap has electrically conductive epoxy extending from the sidewall to the foil.

10. The board on chip package of claim 6 wherein the sidewall has a length, wherein the foil is spaced from a predominate portion of the sidewall length by a gap, and wherein the gap is filled with electrically conductive epoxy extending from the sidewall to the foil.

11. A board on chip package, comprising:
    an insulative substrate having circuitry thereon and an opening therethrough;
    a semiconductive-material-comprising die adhered the substrate and electrically connected to the circuitry with a plurality of electrical interconnects extending through the opening;

a metal foil adhered to a portion of the die with an electrically conductive adhesive; and wherein the die has a first surface facing the substrate and a second surface in opposing relation to the first surface, the foil being in physical contact with only a portion of said second surface.

12. A board on chip package, comprising:

an insulative substrate having circuitry thereon and an opening therethrough;

a semiconductive-material-comprising die adhered to the substrate and electrically connected to the circuitry with a plurality of electrical interconnects extending through the opening;

a metal foil adhered to a portion of the die with an electrically conductive adhesive; and wherein the die has a first surface facing the substrate, a second surface in opposing relation to the first surface, and a sidewall between the first and second surfaces, the foil being adhered to the substrate proximate the sidewall and extending across the sidewall to physically contact the second surface.

13. The board on chip package of claim 12 wherein the sidewall has a length, and wherein the foil physically contacts a predominate portion of the sidewall length.

14. The board on chip package of claim 12 wherein the sidewall has a length, and wherein the foil is spaced from a predominate portion of the sidewall length by a gap.

15. The board on chip package of claim 12 wherein the sidewall has a length, wherein the foil is spaced from a predominate portion of the sidewall length by a gap, and wherein the gap has electrically conductive epoxy extending from the sidewall to the foil.

16. The board on chip package of claim 12 wherein the sidewall has a length, wherein the foil is spaced from a predominate portion of the sidewall length by a gap, and wherein the gap is filled with electrically conductive epoxy extending from the sidewall to the foil.

17. A board on chip package, comprising:

an insulative substrate having circuitry thereon and an opening therethrough;

a semiconductive-material-comprising die adhered to the substrate and electrically connected to the circuitry with a plurality of electrical interconnects extending through the opening, the die having a first surface facing the substrate, a second surface in opposing relation to the first surface, and a sidewall surface extending between the first and second surfaces; and a thermally conductive material in physical contact with at least two of the die first surface, second surface and sidewall surface; the thermally conductive material having a thermal conductivity under specified conditions equal to or greater than the thermal conductivity of elemental copper under the same specified conditions.

18. The board on chip package of claim 17 wherein the thermally conductive material comprises a silver-filled epoxy.

19. The board on chip package of claim 17 wherein the thermally conductive material comprises a metal foil.

20. The board on chip package of claim 17 wherein the thermally conductive material comprises a material selected from the group consisting of aluminum foil and copper foil.

21. The board on chip package of claim 17 wherein the thermally conductive material is in physical contact with the second surface.

22. The board on chip package of claim 17 wherein the thermally conductive material is in physical contact with the sidewall and the second surface.

23. The board on chip package of claim 17 wherein the thermally conductive material is in physical contact with the sidewall, the first surface and the second surface.

24. A board on chip package, comprising:

an insulative substrate having circuitry thereon and an opening therethrough, the substrate comprising a first surface and a second surface in opposing relation to the first surface, the circuitry being on the first surface, the substrate further comprising a cavity extending into the second surface and proximate the opening;

a semiconductive-material-comprising die received within the cavity and electrically connected to the circuitry with a plurality of conductive interconnects extending through the opening, the die having an inner surface facing the substrate and an outer surface in opposing relation to the inner surface;

a metal sheet in physical contact with at least a portion of the die outer surface; and wherein the die is entirely received in the cavity inwardly of the second surface of the substrate, and wherein the sheet extends along the second surface of the substrate and over the cavity to enclose the die in the cavity.

25. A board on chip package, comprising:

an insulative substrate having a pair of opposing surfaces and an opening extending therethrough, the opposing surfaces being a first surface and a second surface;

circuitry on the first surface of the substrate;

a semiconductive-material-comprising die adhered to the second surface of the substrate, the die having a pair of opposing surfaces, one of the die opposing surfaces being a first die surface and being aligned to face toward the second surface of the substrate, the other die surface being a second die surface and being aligned to face away from the second surface of the substrate, the die further comprising first and second opposing sidewalls extending between the first and second surfaces;

electrical interconnects extending from the die, through the opening and to the circuitry;

a metal foil contacting the substrate at a first location proximate the first sidewall and a second location proximate the second sidewall, the metal foil extending across the first and second sidewalls and over the second die surface; the metal foil physically contacting a predominate portion of the second die surface.

26. The board on chip package of claim 25 wherein the metal foil comprises a foil selected from the group consisting of aluminum foil and copper foil.

27. The board on chip package of claim 25 wherein the foil is adhered to the substrate with an electrically conductive epoxy.

28. The board on chip package of claim 25 wherein the foil is in physical contact with only a portion of the second die surface.

29. The board on chip package of claim 25 wherein the foil is in physical contact with an entirety of the second die surface.

30. The board on chip package of claim 25 wherein the sidewall has a length, and wherein the foil physically contacts a predominate portion of the sidewall length.

31. The board on chip package of claim 25 wherein the sidewall has a length, and wherein the foil is spaced from a predominate portion of the sidewall length by a gap.

32. The board on chip package of claim 25 wherein the sidewall has a length, wherein the foil is spaced from a predominate portion of the sidewall length by a gap, and wherein the gap has electrically conductive epoxy extending from the sidewall to the foil.

33. The board on chip package of claim 25 wherein the die is adhered to the substrate with an electrically conductive epoxy.

34. The board on chip package of claim 25 wherein the die comprises a rectangular outer periphery having four sides, wherein the metal foil extends outwardly beyond the outer periphery of the die and contacts the substrate at locations proximate each of the four sides.

* * * * *

UNITED STATES PATENT AND TRADEMARK OFFICE
CERTIFICATE OF CORRECTION

PATENT NO.    : 6,825,550 B2
DATED         : November 30, 2004
INVENTOR(S)   : Salman Akram It is certified that error appears in the above-identified patent and that said Letters Patent is hereby corrected as shown below:

<u>Column 8,</u>
Line 15, delete "23".

<u>Column 11,</u>
Line 8, replace "surface." with -- surface, but not the whole surface. --.

Signed and Sealed this

Second Day of August, 2005

JON W. DUDAS
*Director of the United States Patent and Trademark Office*